(12) United States Patent
Keene

(10) Patent No.: US 10,884,153 B2
(45) Date of Patent: Jan. 5, 2021

(54) MAGNETIC DETECTORS

(71) Applicant: METRASENS LIMITED, Malvern (GB)

(72) Inventor: Mark Nicholas Keene, Malvern (GB)

(73) Assignee: Metrasens Limited, Worcestershire (GB)

( * ) Notice: Subject to any disclaimer, the term of this patent is extended or adjusted under 35 U.S.C. 154(b) by 74 days.

(21) Appl. No.: 15/998,553

(22) PCT Filed: Feb. 14, 2017

(86) PCT No.: PCT/GB2017/050387
§ 371 (c)(1),
(2) Date: Aug. 15, 2018

(87) PCT Pub. No.: WO2017/141022
PCT Pub. Date: Aug. 24, 2017

(65) Prior Publication Data
US 2019/0079211 A1 Mar. 14, 2019

(30) Foreign Application Priority Data
Feb. 15, 2016 (GB) .................................. 1602652.8

(51) Int. Cl.
*G01R 33/00* (2006.01)
*G01V 3/08* (2006.01)
(Continued)

(52) U.S. Cl.
CPC ................ *G01V 3/081* (2013.01); *G01V 3/38* (2013.01); *G08B 13/24* (2013.01); *G01R 33/02* (2013.01)

(58) Field of Classification Search
CPC ........ G01R 33/0047; G01V 3/08; G01V 3/38; G01V 3/081; G01V 3/087; G01V 3/104; G01V 8/10; G08B 13/24
See application file for complete search history.

(56) References Cited

U.S. PATENT DOCUMENTS 3,573,817 A 4/1971 Akers
3,697,972 A 10/1972 Brown
(Continued)

FOREIGN PATENT DOCUMENTS

CN 2172891 Y 7/1994
CN 101383071 A 3/2009
(Continued)

OTHER PUBLICATIONS

Great Britain Search Report for Appl No. GB1602652.8 dated May 11, 2016, 3 pages.

*Primary Examiner* — Neel D Shah
(74) *Attorney, Agent, or Firm* — Maine Cernota & Rardin

(57) ABSTRACT

A security screening apparatus for differentiating between ferromagnetic objects having different magnetisation comprises at least one magnetic sensor (106) arranged to produce a signal indicative of an ambient magnetic field or gradient over a zone of sensitivity (128) around the sensor, and a signal processing circuit which receives as an input the signal from the magnetic sensor and a detection circuit that determines whether a signal is above a detection threshold, which, in response to a detection, emits an alert signal; and detection zone defining means for defining a detection zone within the zone of sensitivity, the detection zone including an inner bound at a predetermined distance from the magnetic sensor. The detection zone defining means is configured such that objects with a large magnetisation, such as rifles, shotguns or shrapnel suicide vests, are detectable within the detection zone to the extent that they cause an alert signal to be emitted, whilst objects with a smaller magnetisation do not cause an alert to be emitted. The zone defining means could be a physical barrier (130) such as a pole or fence.

19 Claims, 5 Drawing Sheets

(51) Int. Cl.
*G01V 8/10* (2006.01)
*G08B 13/24* (2006.01)
*G01V 3/38* (2006.01)
*G01R 33/02* (2006.01)

(56) References Cited

U.S. PATENT DOCUMENTS

| | | |
|---|---|---|
| 3,758,849 A | 9/1973 | Susman et al. |
| 3,763,424 A | 10/1973 | Bennet et al. |
| 3,971,983 A | 7/1976 | Jaquet |
| 4,024,468 A | 5/1977 | Hirschi |
| 4,068,164 A | 1/1978 | Schwartz et al. |
| 4,087,814 A | 5/1978 | Spirig |
| 4,249,128 A | 2/1981 | Karbowski |
| 4,413,232 A | 11/1983 | Most et al. |
| 4,434,191 A | 2/1984 | Cook et al. |
| 4,467,251 A | 8/1984 | Jonsson |
| 4,472,908 A | 9/1984 | Wanzl et al. |
| 4,488,115 A | 12/1984 | Podhrasky |
| 4,698,937 A | 10/1987 | Kornbrekke et al. |
| 4,942,360 A | 7/1990 | Candy |
| 4,962,473 A | 10/1990 | Crain |
| 5,039,981 A | 8/1991 | Rodriguez |
| 5,148,151 A | 9/1992 | Podhrasky |
| 5,345,222 A | 9/1994 | Davies et al. |
| 5,414,410 A | 5/1995 | Davies et al. |
| 5,456,718 A | 10/1995 | Szymaitis |
| 5,959,451 A | 9/1999 | De Torfino |
| 5,996,281 A | 12/1999 | Takano et al. |
| 6,133,829 A | 10/2000 | Johnstone et al. |
| 6,150,810 A | 11/2000 | Roybal |
| 6,308,644 B1 | 10/2001 | Diaz |
| 6,342,835 B1 | 1/2002 | Nelson-White |
| 6,541,966 B1 | 4/2003 | Keene |
| 6,696,947 B1 | 2/2004 | Bybee |
| 7,113,092 B2 | 9/2006 | Keene |
| 7,296,683 B1 | 11/2007 | Vallelonga, Sr. et al. |
| 7,408,461 B2 | 8/2008 | Fluck |
| 7,414,404 B2 | 8/2008 | Keene |
| 7,489,128 B2 | 2/2009 | Kopp |
| 7,525,308 B2 | 4/2009 | Tsukada et al. |
| 7,893,690 B2 | 2/2011 | Simon |
| 8,450,678 B2 | 5/2013 | Sasaki et al. |
| 2002/0148965 A1 | 10/2002 | Haufe |
| 2003/0080868 A1 | 5/2003 | Nelson |
| 2003/0171669 A1 | 9/2003 | Kopp |
| 2004/0041084 A1 | 3/2004 | Carlson |
| 2004/0080315 A1 | 4/2004 | Beevor et al. |
| 2004/0135687 A1 | 7/2004 | Keene |
| 2004/0147833 A1 | 7/2004 | Czipott et al. |
| 2005/0119547 A1 | 6/2005 | Shastri et al. |
| 2005/0242817 A1 | 11/2005 | Hoult |
| 2005/0264416 A1 | 12/2005 | Maurer |
| 2006/0145691 A1 | 7/2006 | Massengill et al. |
| 2006/0158331 A1 | 7/2006 | Massengill et al. |
| 2006/0197523 A1 | 9/2006 | Palecki et al. |
| 2007/0040692 A1 | 2/2007 | Smith et al. |
| 2007/0052411 A1 | 3/2007 | McClure et al. |
| 2007/0057786 A1 | 3/2007 | McClure et al. |
| 2007/0132581 A1 | 6/2007 | Molyneaux et al. |
| 2007/0133844 A1 | 6/2007 | Waehner et al. |
| 2007/0182550 A1 | 8/2007 | Castello et al. |
| 2007/0290843 A1 | 12/2007 | Manneschi |
| 2007/0296576 A1 | 12/2007 | Holowick |
| 2008/0001735 A1 | 1/2008 | Tran |
| 2008/0080178 A1 | 4/2008 | Kita et al. |
| 2008/0084301 A1 | 4/2008 | Roybal et al. |
| 2008/0117044 A1 | 5/2008 | Hibbs |
| 2008/0136631 A1 | 6/2008 | Fluck |
| 2008/0157965 A1 | 7/2008 | Shahar |
| 2008/0231443 A1 | 9/2008 | Kotter et al. |
| 2009/0122547 A1 | 5/2009 | Hou |
| 2009/0167307 A1 | 7/2009 | Kopp |
| 2009/0273340 A1 | 11/2009 | Stephanson et al. |
| 2009/0284405 A1 | 11/2009 | Salmon et al. |
| 2010/0013461 A1 | 1/2010 | Masubuchi et al. |
| 2010/0026510 A1 | 2/2010 | Kiani et al. |
| 2010/0156407 A1* | 6/2010 | Lausch ............... G01V 3/081 324/259 |
| 2010/0156638 A1 | 6/2010 | McClure et al. |
| 2010/0315080 A1 | 12/2010 | Duncan et al. |
| 2010/0319256 A1 | 12/2010 | Agam et al. |
| 2011/0057788 A1 | 3/2011 | Talkington et al. |
| 2011/0102597 A1 | 5/2011 | Daly et al. |
| 2011/0172953 A1 | 6/2011 | Kim |
| 2011/0285390 A1 | 11/2011 | Jewitt et al. |
| 2012/0038456 A1 | 2/2012 | Pikkarainen et al. |
| 2012/0074943 A1 | 3/2012 | MacLeod et al. |
| 2013/0187788 A1 | 7/2013 | Salter |
| 2013/0229518 A1 | 9/2013 | Reed et al. |
| 2013/0307533 A1* | 11/2013 | Keene ............... G01V 3/087 324/244 |
| 2014/0232382 A1 | 8/2014 | Goodyear et al. |
| 2014/0248833 A1 | 9/2014 | Royle et al. |
| 2016/0003753 A1* | 1/2016 | Augustine ........... G01N 24/084 324/309 |

FOREIGN PATENT DOCUMENTS

| | | |
|---|---|---|
| CN | 102682553 A | 9/2012 |
| CN | 103747725 A | 4/2014 |
| EP | 0097139 A2 | 12/1983 |
| GB | 2395276 A | 5/2004 |
| JP | 2006505781 A | 2/2006 |
| JP | 2008249584 A | 10/2008 |
| WO | 03069320 A2 | 8/2003 |
| WO | 2008028487 A1 | 3/2008 |
| WO | 2011086369 A1 | 7/2011 |
| WO | 2012022971 A2 | 2/2012 |
| WO | 2014064429 A2 | 5/2014 |

* cited by examiner

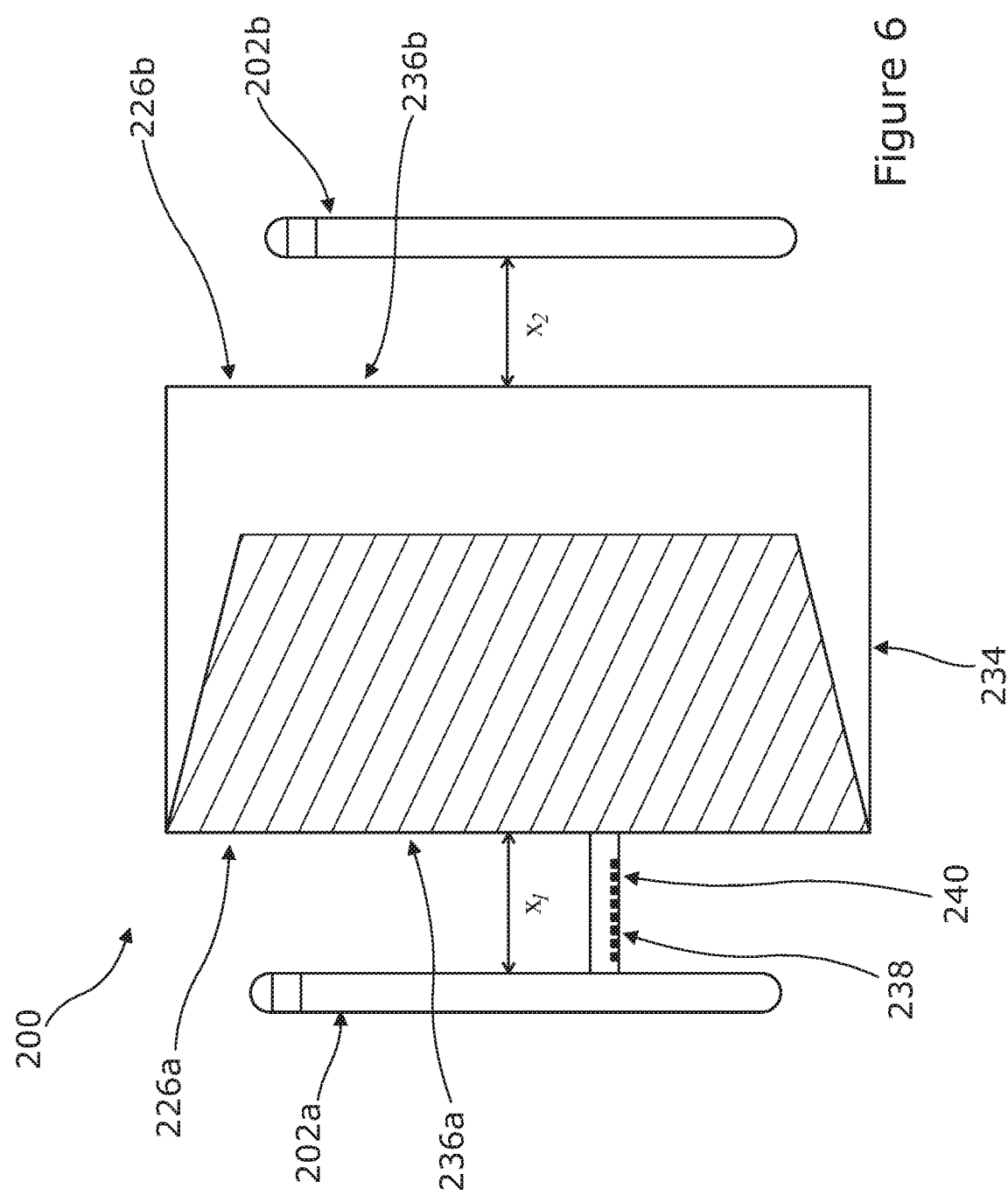

MAGNETIC DETECTORS

RELATED APPLICATIONS

This application is a national phase application filed under 35 USC § 371 of PCT Application No. PCT/GB2017/050387 with an International filing date of Feb. 14, 2017, which claims priority of GB Patent Application GB1602652.8 filed Feb. 15, 2016. Each of these applications is herein incorporated by reference in its entirety for all purposes.

FIELD OF THE INVENTION

The present invention relates to security systems and to methods of use of security systems. In particular, the present invention relates to security systems which may be configured to emit an alert signal only in the presence of an object with a relatively high magnetisation.

BACKGROUND OF THE INVENTION

Due to instances of targeted attacks in public places, there has been increased interest in providing security in places where it was previously considered unnecessary. For instance, shopping malls, sports events, concert halls, and other 'soft targets' are all now subject to enhanced security. However, where large numbers of people are required to be security screened, current methods of providing this security are slow and disruptive.

It is neither practical nor affordable to operate conventional security checkpoints everywhere crowds gather. The use of archway metal detectors or hand wands to find guns is slow and therefore restricts the flow of people. This is particularly inconvenient and undesirable in situations where high flow is needed. To increase the security of such places, it would be beneficial to have a security checkpoint capable of a significantly higher throughput and operable at a substantially lower cost than conventional security checkpoints. Such checkpoints could be deployed far more broadly and in greater number, particularly at locations considered to be 'soft targets'.

SUMMARY OF THE INVENTION

In accordance with a first aspect of the invention, there is provided a security screening apparatus for differentiating between ferromagnetic objects having different magnetisation, comprising: at least one magnetic sensor arranged to produce a signal indicative of an ambient magnetic field or gradient over a zone of sensitivity around the sensor, and a signal processing circuit which receives as an input the signal from the magnetic sensor and a detection circuit that determines whether a signal is above a detection threshold, which, in response to a detection, emits an alert signal; and detection zone defining means for defining a detection zone within the zone of sensitivity, the detection zone including an inner bound at a predetermined distance from the magnetic sensor, the detection zone defining means being configured such that objects with a large magnetisation, such as rifles, shotguns or shrapnel suicide vests, are detectable within the detection zone to the extent that they cause an alert signal to be emitted, whilst objects with a smaller magnetisation do not cause an alert to be emitted.

The distance between the sensor and the inner bound may be at least 30 cm, 40 cm, 60 cm, or 80 cm.

The detection threshold may be determined by a user-operable control which is adjustable to enable objects with smaller magnetisation to pass through the detection zone without causing an alert to be emitted.

Preferably, the detection zone may also include an outer bound, whereby objects with a large magnetisation are detectable between the inner and outer bounds to the extent that they cause an alert signal to be emitted.

It is preferable that the distance between the inner and outer bounds may be large enough to contain the whole body of a person, or that it is at least 1 metre, at least 2 metres, or at least 3 metres.

Preferably, objects with a large magnetisation are defined as those with a magnetisation above a predetermined limit. The predetermined limit may be between 30 and 500 mA·m$^2$, or more preferably between 70 and 300 mA·m$^2$, or most preferably substantially 100 mA·m$^2$. These limits are based upon the statistical distribution of the magnetisations of various weapons and other items. Therefore, the predetermined limit of the invention may fall outside of these ranges where the aim is to preferentially detect items having a higher or lower magnetisation than those proposed.

The predetermined distance may be determined by a function of the predetermined limit and a threshold sensitivity of the apparatus.

Advantageously, the or each bound of the detection zone may include one or more physical barriers. These barriers may include freestanding barriers such as poles or fences, or pre-existing barriers such as architectural features including walls and the like. Preferably, physical barriers will allow magnetic fields to pass through relatively unimpeded.

The or each bound of detection zone may additionally or alternatively include one or more guidelines which act to guide people through the zone of sensitivity at the correct distance from the sensor.

The sensors may be supported as a predefined distance from a floor on which people or objects are supported, the inner bound being set in a range determined by the distance of the sensors from the closest part of a person or object on the floor. If above the floor, the closest part will typically be the head of a standing person, if below the floor it will typically be the feet. In each case there is a barrier—the ground or space beneath the floor or air above a person or object.

It may be beneficial for the security screening apparatus to further comprise a rangefinder for detecting when a person passes outside of the detection zone, the rangefinder emitting a further alert signal.

The alert signal and/or further alert signal may include a visible alert, an audible alert, or an electronic signal. As such, the alert need not necessarily be issued in the immediate vicinity of the system and the electronic signal could, for instance, trigger other systems. In one such circumstance, the alert signal and/or further alert signal could activate a remote alarm unit.

In accordance with a second aspect of the invention, there is provided a method of erecting a security screening apparatus comprising at least one magnetic sensor arranged to produce a signal indicative of an ambient magnetic field or gradient over a zone of sensitivity around the sensor, and a signal processing circuit which receives as an input the signal from the magnetic sensor and a detection circuit that determines whether a signal is above a detection threshold, which, in response to a detection, emits an alert signal, the method comprising the step of: positioning the security screening apparatus or a detection zone defining means for defining a detection zone within the zone of sensitivity, such that an inner bound of the detection zone is at least a predetermined distance from the magnetic sensor such that objects with a large magnetisation, such as rifles, shotguns or shrapnel suicide vests, are detectable within the detection zone to the extent that they cause an alert signal to be emitted, whilst objects with a smaller magnetisation do not cause an alert to be emitted.

The method may further comprise the step of adjusting a detection threshold determined by a user-operable control to enable objects with a smaller magnetisation to pass through the detection zone without causing an alert to be emitted.

Preferably, the method may further comprise the step of the step of positioning the security screening apparatus or the detection zone defining means such that an outer bound is provided on the detection zone such that objects with a large magnetisation are detectable between the inner and outer bounds to the extent that they cause an alert signal to be emitted.

An instructing device may be used for positioning security screening apparatus or the detection zone defining means. The instructing device may include an instruction manual or a template.

In accordance with a third aspect of the invention, there is provided a kit of parts for enabling the method in accordance with the second aspect of the invention, the kit of parts comprising a security screening apparatus including at least one magnetic sensor arranged to produce a signal indicative of an ambient magnetic field or gradient over a zone of sensitivity around the sensor, and a signal processing circuit which receives as an input the signal from the magnetic sensor and which, in response to a change in the signal, emits an alert signal; and an instructing device.

Preferably, the instructing device may include an instruction manual and/or a template.

The kit of parts may preferably comprise detection zone defining means.

BRIEF DESCRIPTION OF THE DRAWINGS

The invention will now be described in detail with reference to the accompanying drawings, in which:

FIG. 6 shows a second embodiment of the present invention, arranged about a doorway.

DETAILED DESCRIPTION

In order to provide a high throughput, it is desirable to avoid some of the practical necessities which are involved in standard metal detectors. Where archway metal detectors are used, it is necessary for people passing through to divest themselves of any metallic belongings before passing through. The time taken to divest and re-acquire metal objects limits the throughput possible for each archway device. Without separation, the clutter caused by metal objects passing through renders the detector ineffective.

Figure 1:
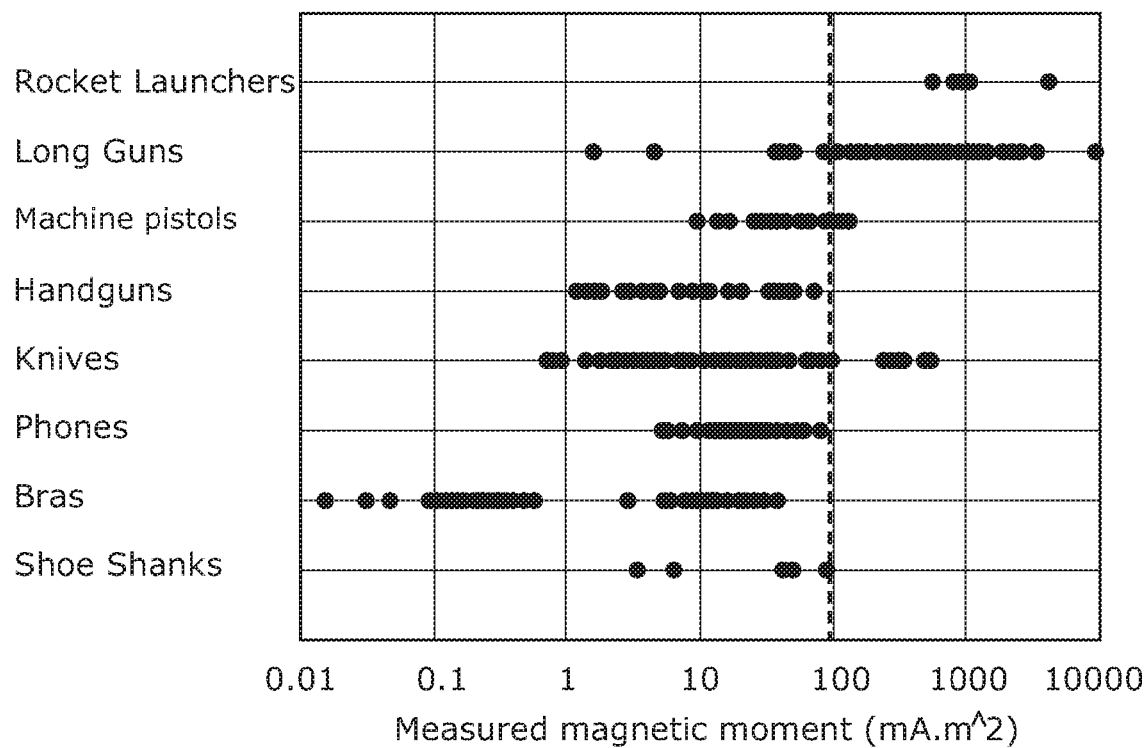
FIG. 1 shows a range of measured magnetic moment of different ferromagnetic objects.

As shown in FIG. 1, the measured magnetic moment of many different weapons and belongings has been recorded by the applicant. These include everyday items such as cell phones, bra under-wires, and shoe shanks, as well as weapons ranging from knives and handguns, to long guns and rocket launchers. The applicant has noticed that the majority of mass killings are enabled by the use of automatic or semi-automatic weapons, such as assault rifles, which fall within the long gun category of FIG. 1.

The long guns which have been measured for their magnetic moments include 22 variants of the Kalashnikov family, 8 variants each of the M16 and G3 families, 6 variants of the FAL family, 8 shotguns, and 23 other assault weapons. As can be seen from FIG. 1, with a few exceptions, the long guns have magnetic moments of at least 30 mA·m$^2$. However, cell phones and shoe shanks may also have similar magnetic moments to some of the less magnetic long guns, for instance, up to 100 mA·m$^2$.

It is therefore considered by the applicant that a system capable of differentiating between the higher magnetic moments of long guns and other objects, without requiring any divestment of common ferromagnetic objects from the throughput of people past a security point will be beneficial.

Figure 2:
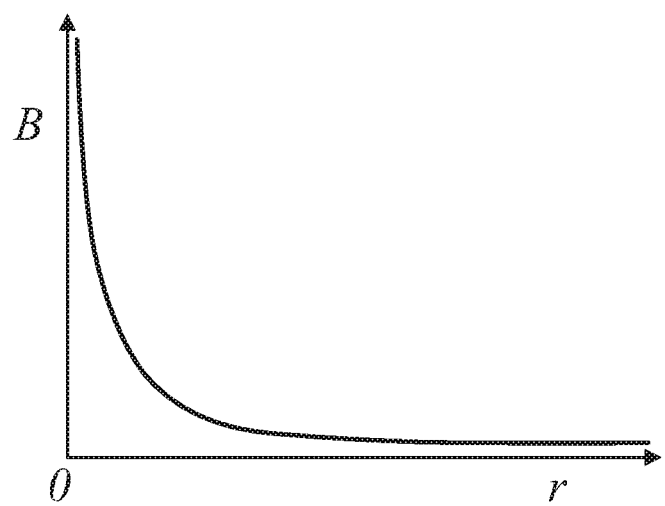
FIG. 2 depicts the relationship of magnetic field strength to distance from the magnetic dipole of an object.

It is known in the art of ferromagnetic detecting that the magnetic field associated with a magnetic moment, or magnetism, of an object, follows an inverse power law to the distance of the object from the detector. This relationship is shown in FIG. 2, where B is the magnetic field strength and r is the distance of the object from the detector.

Where the length of a ferromagnetic object is short compared to the range at which the magnetic field is measured, known as the dipole limit, the field strength, B, is inversely proportional to the cube of the distance, r, from the detector. At shorter distances, where r is similar to or shorter than the length of the object, the magnetic field strength changes in proportion to a lower power of r, but nonetheless still decays at increasing range. In general, the magnetic field scales as:

$$B = \frac{k \cdot m}{r^{a(r)}}$$

Where m is the magnetisation, a(r) is 3 at long range and less otherwise, and k is a constant of proportionality specific to the geometry of angles between r, B, and m. Considering, for simplicity, the long range case, we can say that:

$$B \propto \frac{m}{r^3}$$

As such, when using a single magnetometer, as commonly used in the detection of ferromagnetic objects, it is not possible to ascertain the magnetisation of an object without knowing its range from the detector, and vice versa—i.e. an object having a large magnetisation, such as an automatic rifle, which is at a large distance from the detector may have the same magnetic field strength as an object having a smaller magnetisation, such as a cell phone, which is at a shorter distance from the detector.

However, by differentiating the above equation, it is possible to see that the uniformity of the magnetic field increases with the greater distance from the detector as follows:

$$\frac{\partial B}{\partial r} \propto -\frac{3m}{r^4}$$

Figure 3A:
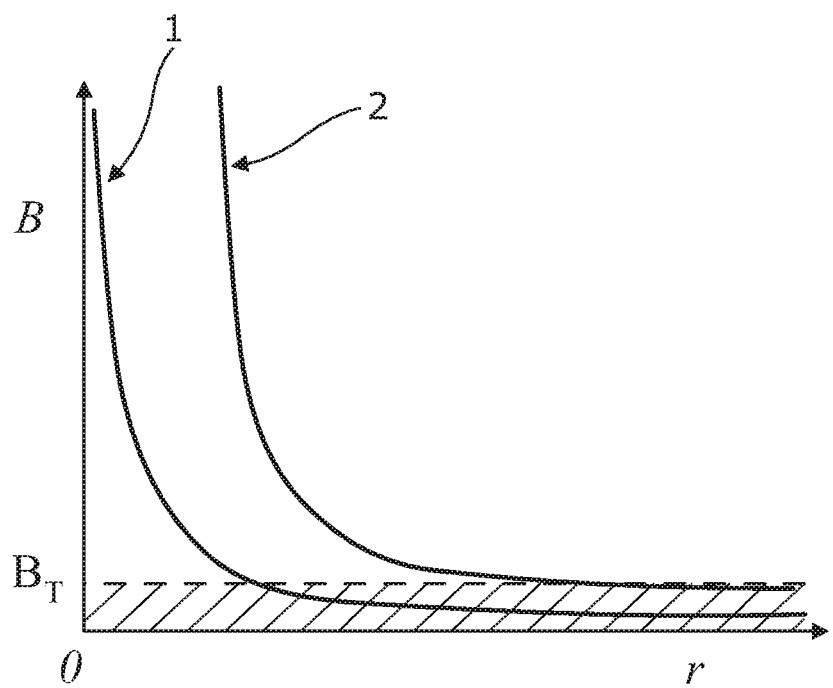
FIG. 3a shows a detection threshold of a prior art security screening apparatus and its relationship to two objects having different magnetisations.

As shown in FIG. 3a, where the magnetic field strength against range is shown for two objects 1, 2 having different magnetisations, the inherent problem with the use of known ferromagnetic detector systems is shown. In known devices, the detector emits an alert signal whenever a magnetic field is detected which is above a specific detection threshold, $B_T$, which is chosen in order to prevent or limit the chance of false alarms due to fluctuations in magnetic field due to small objects. As can be seen, this means that the closer the less magnetic object 1 is to the detector, the more likely it is to cause a false alarm to be emitted.

Figure 3B:
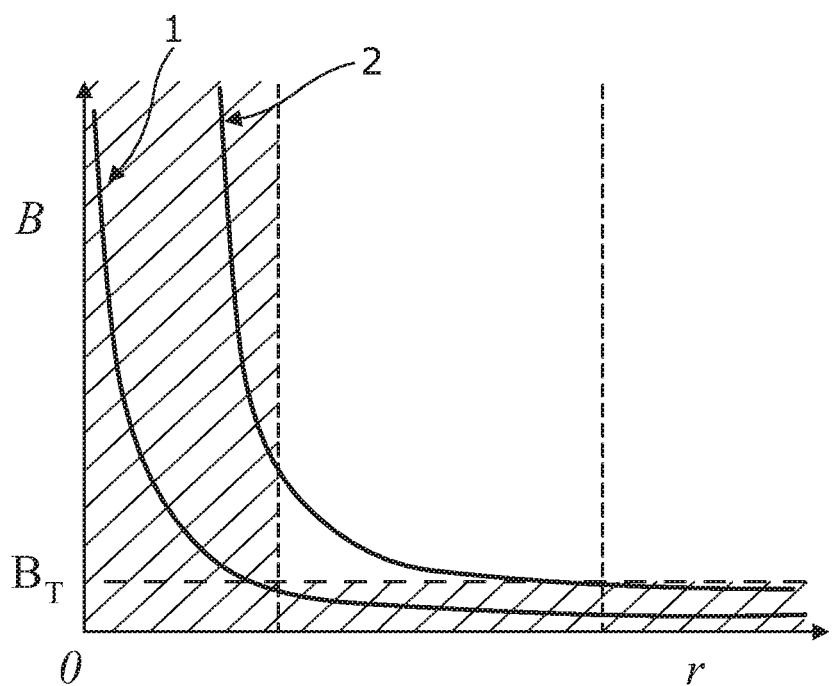
FIG. 3b shows a detection threshold of a security screening apparatus in accordance with the first aspect of the invention and its relationship to two objects having different magnetisations.

Conversely, in FIG. 3b, a system in accordance with the present invention is shown. Here, the detector is configured such that an active range over which it operates is limited such that it is not possible for the less magnetic object 1 with a magnetisation below a predetermined level to cause a false alarm, whilst the more magnetic object 2 may still activate an alert signal.

Figure 4A:
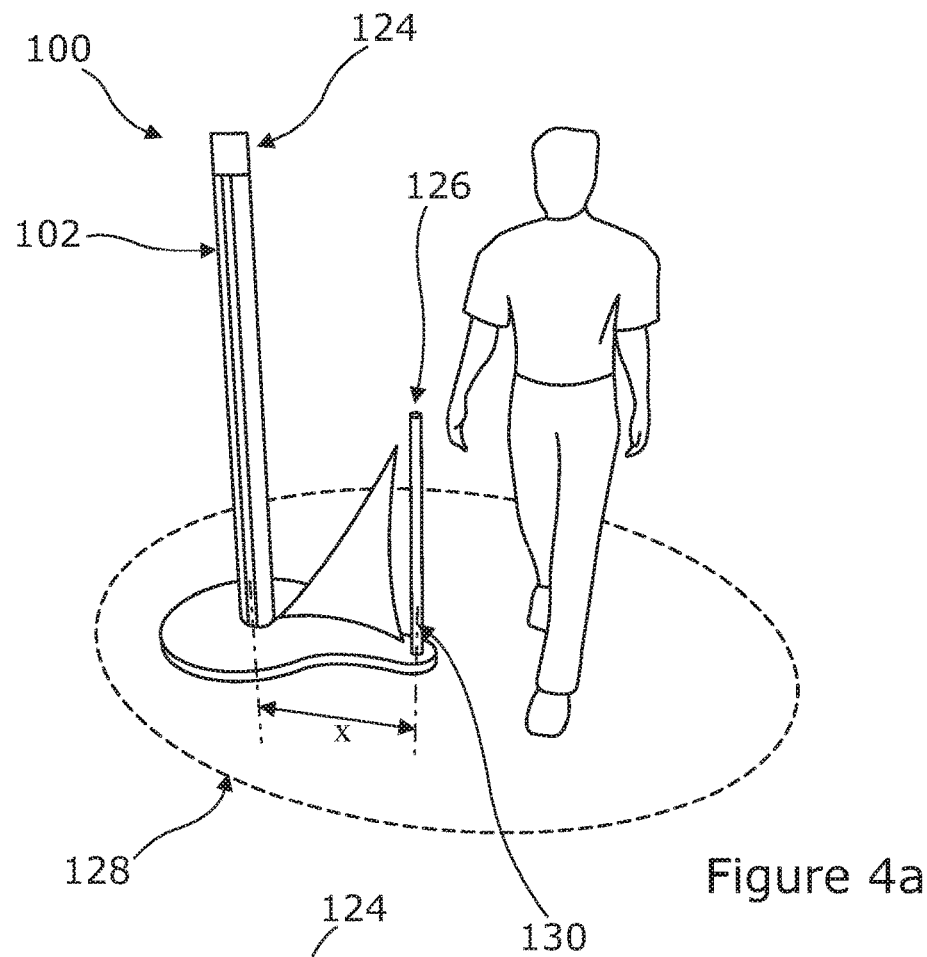
FIGS. 4a and 4b show an embodiment of the first aspect of the invention, including an inner bound and optional outer bound as part of a detection zone defining means.
Figure 4B:
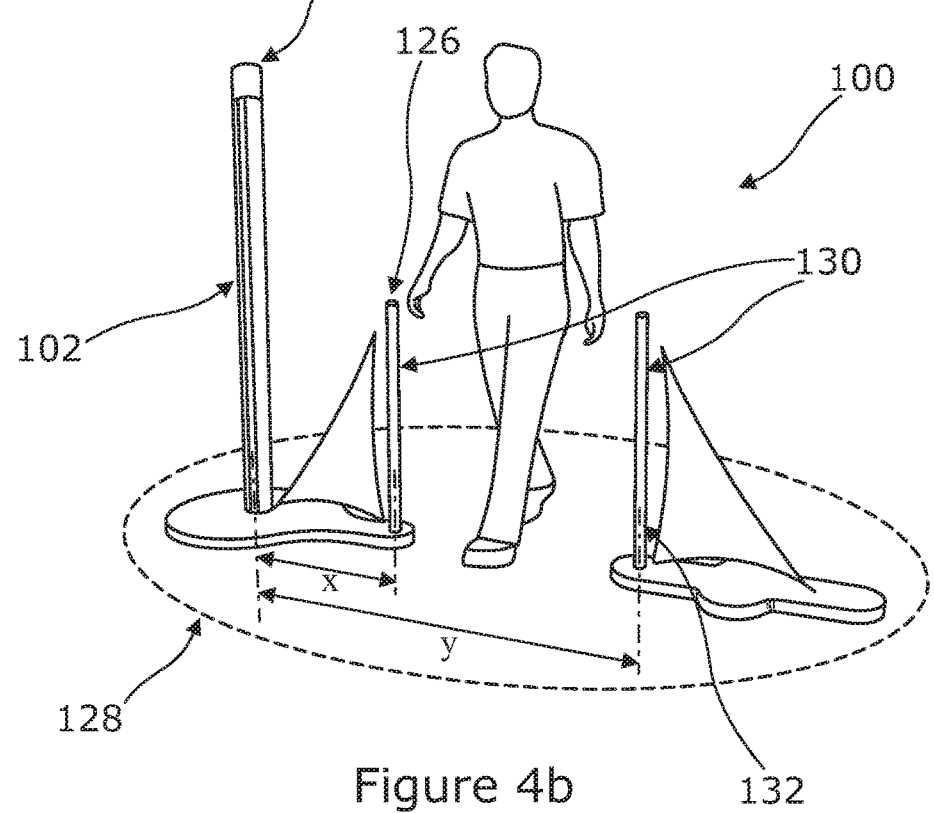
Figure 5:
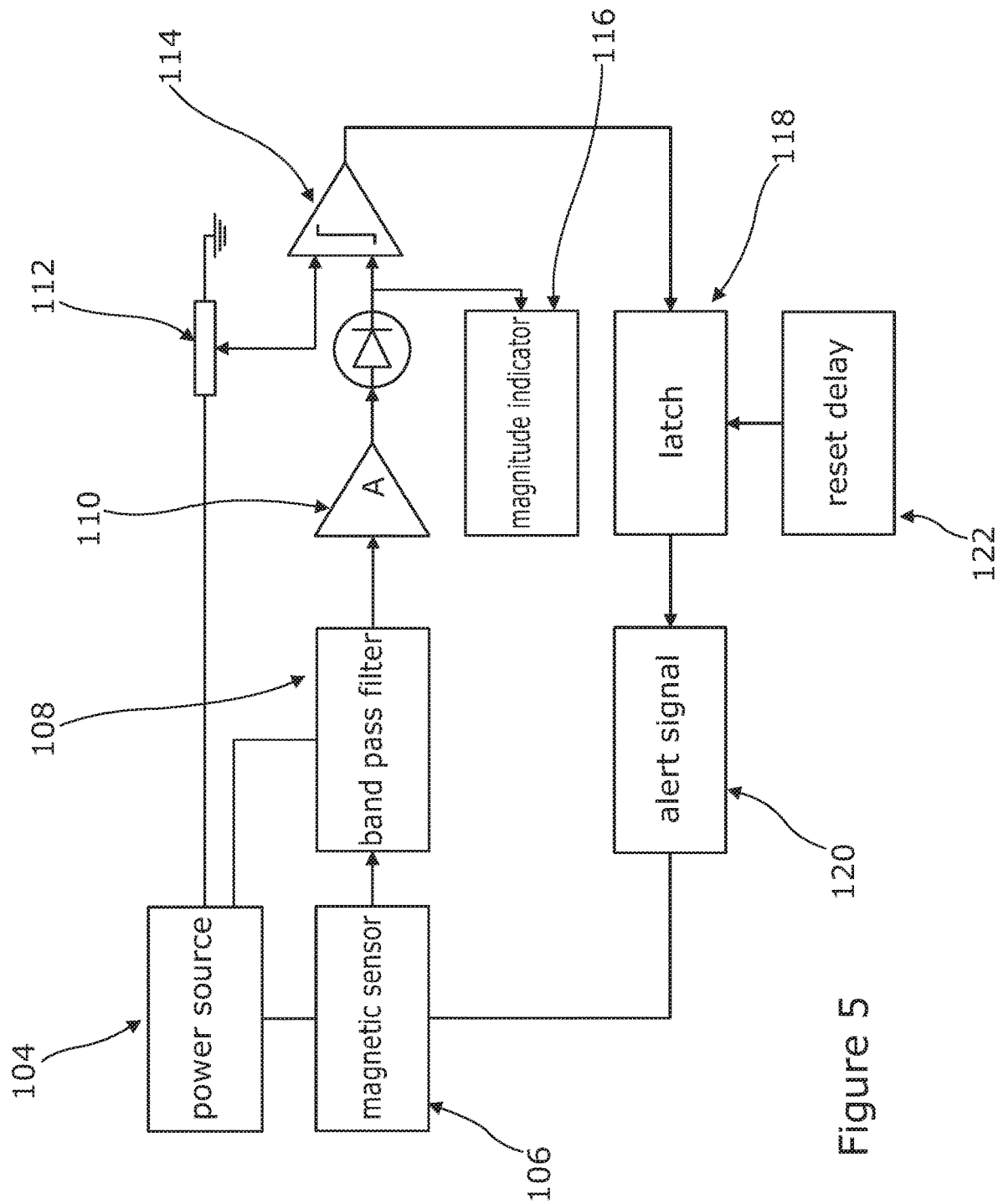
FIG. 5 depicts the electronic circuitry of the security screening apparatus of FIG. 5.

A first embodiment of a security screening apparatus 100 in accordance with the present invention is shown in FIGS. 4a and 4b. The security screening apparatus 100 of the present embodiment comprises an elongate pole shaped housing 102 made of aluminium or other non-ferrous material. The housing 102 contains all of the sensors and electronic circuitry which are required to operate the device. The electronic circuitry is depicted in FIG. 5.

A power source 104, which may be a battery or mains power supply, is connected to a magnetic sensor 106 which is capable of detecting ambient magnetic fields. This kind of magnetic sensor 106 can thus sense the change of magnetic field induced by the magnetic field surrounding ferromagnetic objects carried by a person in the vicinity of the sensor. Such a magnetic sensor 106 may be a first order, second order, or high magnetic gradiometer or an array of magnetometers or gradiometers.

The signal obtained from the magnetic sensor may be passed through a filter such as a band pass filter 108 in order to remove noise which may interfere with the sensing and any static background field, and then passed through an amplifier 110. Once amplified, the signal is compared to a threshold sensitivity, or detection threshold, of the system, which may be adjusted by a variable resistor 112. The comparison is completed by a comparator 114.

A magnitude indicator 116 may also be used to indicate the strength of the magnetic field being sensed by the magnetic sensor 106 at any given time. Such an indicator 116 may include a visual indication such as a series of lights, or any other sort of indicator.

It will be appreciated by those familiar with the art that signals from the sensor 106 may be immediately digitised and all the following functions may equivalently be algorithms in a digital processor.

When the signal is determined to be above the threshold sensitivity of the apparatus 100, a latch 118 is activated which results in an alert signal 120 being generated. The latch 118 combines with a reset delay 122 such that the alert signal 120 is automatically cancelled after a predetermined period. However, the latch 118 is not necessary to the present invention and instead the comparator 114 may directly result in the output of the alert signal 120, which is then cancelled as soon as the signal returns below the threshold sensitivity of the apparatus 100.

The alert signal 120 may be a visual alert such as a light, an audible alert such as an alarm, or may be an electronic signal such as a wireless signal which produces an alert on a separate device. For example, a wireless signal may be generated which communicates with an overall security system or a control room, in order to indicate the presence of an abnormally large magnetic field. In the presently shown embodiment, the alert signal 120 is a beacon 124 positioned towards the upper end of the housing 102.

Referring again to FIG. 4a, a detection zone defining means defines an inner bound 126 within a zone of sensitivity 128 of the apparatus. This inner bound 126 acts to prevent a person, and therefore any ferromagnetic objects they may be carrying, passing closer than a predetermined distance, x, of the magnetic sensor 106. The predetermined distance may be determined by a function of the threshold sensitivity of the magnetic sensor 106 and the predetermined limit of the magnetisation of objects desired to be detected. Thus, the detection zone defining means defines a detection zone within the zone of sensitivity, within which objects with a large magnetisation can be detected.

The relationship between the threshold field $B_T$ the maximum magnetic moment to be ignored, $m_{max}$ and the minimum distance to the detection zone x is given by;

$$B_T \geq \frac{k \cdot m_{max}}{x^3}$$

where k is a constant of $2 \times 10^{-7}$ in SI units.

In practice, users of this apparatus cannot be expected to perform this calculation for every circumstance so the following approach may be adopted. The inner bound may be set to a broadly sensible value which we have found to be between 40 and 80 cm preferably 60 cm. The threshold $B_T$ may be set, for instance by the a user-operable control such as the variable resistor 112, so that the majority of people being screened pass without detection. Therefore the maximum moment $m_{max}$ does not need to be empirically determined. This simply optimises the apparatus for each situation using one simple control and is adaptable to different $m_{max}$ that may be encountered in different situations.

The inner bound 126 of the present embodiment takes the form of a physical barrier 130 which in this case is a pole. The result of the physical barrier 130 is that no ferromagnetic objects with a magnetisation below the predetermined limit are able to activate the alert signal, due to the fact that they are prevented from approaching the magnetic sensor 106 closer than the predetermined distance, x.

The magnetic sensors may be located above the people or objects being screened, e.g. attached to a gantry or suspended from a ceiling. In this case the physical barrier is the natural clearance between the height of the sensors and the height of the people or objects who are in effect constrained in location by the floor. Conversely, the magnetic sensors may be set below the people or objects being screened e.g. beneath the floor. In this case the physical barrier is the burial depth of the sensors in combination with the constraint provided by the floor itself which determines where the people are positioned. In each case the detection zone defining means is defined at least in part by the support for the sensors and by the floor.

Alternatively, the detection zone could be defined by a guideline or other mark, rather than a physical barrier 130. When obeyed, the guideline or other mark would produce the same effect as the use of a physical barrier 130.

In FIG. 4b, an outer bound 132 is added to the system shown in FIG. 4a. This outer bound 132 performs the same function as the inner bound 126 but in relation to preventing objects passing too far away from the magnetic sensor 106. If objects with a large magnetisation are allowed to pass through the zone of sensitivity 128 beyond a distance, y, after which their magnetic field detected by the magnetic sensor 106 is below the threshold sensitivity of the system, the magnetic sensor 106 will not cause the alert signal 120 to be emitted. As such, the outer bound 132 acts to prevent such an occurrence. As for the inner bound 126, the outer bound 132 also takes the form of a physical barrier 130, although this may not always be the case, as discussed previously.

The detection zone defining means of the present embodiment therefore comprises the physical barriers which define the inner bound and outer bound of the detection zone. The detection zone is therefore the area between the physical barriers, within which objects with a large magnetisation, such as those with a magnetisation above a predetermined limit, will be detected, whilst those with a smaller magnetisation will not.

FIG. 6 shows a second embodiment of the security screening apparatus 200 of the first aspect of the invention. However, in this embodiment the system is being used in conjunction with a doorway 234. The second embodiment includes two housings 202a, 202b, each of which contains a magnetic sensor and circuitry. The housings 202a, 202b, magnetic sensors, and circuitry of the embodiment may be considered to be similar or identical to the first embodiment, and therefore substantial repetition of the detailed description is hereby omitted, for brevity. In addition, similar or identical references to the first embodiment are used, where possible.

Rather than providing separate physical barriers for use to define the inner bounds 226a, b of the detection zone (not shown), the second embodiment utilises the architectural features of the structure upon which they are mounted. Therefore, the edges 236a, 236b of the doorway 234 act as the inner bound 226a, 226b of each detection zone.

In order that the inner bound 226a, 226b for each detection zone is in the correct place within the zone of sensitivity (not shown), and as the doorway 234 itself is fixed, it is necessary for the housings 202a, 202b to be positioned the correct distance $x_1$, $x_2$ from their corresponding inner bound 226a, 226b. In order to assist with this, it may be necessary to include an instructing device, such as a template 238, which may be used to position each housing accurately. The template 238 may then be removed. Alternatively, an instruction manual may be usable, in place of a template 238, which simply describes the correct positioning of the housing in relation to an architectural feature or other form of detection zone defining means.

If the threshold sensitivity or predetermined limit of magnetisation is to be adjusted, it will be apparent that it may be desirable to also adjust the distance from the bounds of the detection zone. Therefore, the template 238 may include different markings 240 which correspond to the different settings of the threshold sensitivity, or markings 240 which correspond to different predetermined limits of magnetisation. This will assist with the correct erection of the security screening apparatus 200.

Considering the second embodiment, it will be clear that there is no necessity to provide an outer bound for the detection zone of either housing 202a, 202b. This is because, as a person travels through the doorway 234, they will necessarily enter the detection zone of one or both housings 202a, 202b. As long as the hypothetical outer bounds would be coincidental to one another or in a position closer to the opposing housing 202a, 202b, no outer bound is necessary. In the event that the security screening apparatus were to be adapted such that only one housing and magnetic sensor were used, it may be desirable to include an outer bound if the opposing edge of the doorframe were to be further from the magnetic sensor than the hypothetical outer bound.

The spatial orientation of the apparatus is not confined or restricted. For example the sensor may be placed a distance x below a floor and people or objects pass above it, or it may be a distance x above head height and people walk below it. For these cases additional restriction would be required to ensure people or objects pass directly over or under the sensors.

As is clear from the discussed embodiments, it is desirable for the detection zone within which an object having a larger magnetisation is detectable to be large enough for the whole body of a person to pass. This ensures that the security screening apparatus should not be possible to avoid. If the detection zone is wider, such as 1 metre or 2 metres, for example, this will allow a greater number of people to pass through the detection zone at any one time. However, it may be beneficial to have more than one apparatus set in opposition as shown in FIG. 6 as this allows for a wider zone 234 than a single apparatus.

The detection zone defining means, defining inner and/or outer bounds, may be provided as a part of the housing of the security screening apparatus. This enables the entire system to be easily relocated, when necessary, and also may ensure that the inner and/or outer bounds are always in the correct position for operation.

Although the second embodiment is described as being mounted about a doorway, it may instead be formed within a structural feature such as a door, pillar, or wall, or could be freestanding by such a structural feature whilst the structural feature is still utilised as the detection zone defining means.

If desired, it may be possible use a rangefinder as the detection zone defining means, which detects when people are passing by outside of the detection zone. Such a rangefinder could include a radar or infrared detector or similar, and be configured such that a further alert signal is generated to alert the user that people are beyond the distance within which detection is possible. Thus, further checking could be conducted on these people by security services or similar, or these people could be redirected to pass through the zone of sensitivity again.

Whilst described in terms of the detection of weapons in particular, such a system as described above may be equally useful in terms of alerting a person that they are entering an unsafe area. For example, it is desirable to prevent people entering the vicinity of an MRI machine with an object which has a large magnetisation which could become a projectile. Therefore, positioning such security screening apparatus as hereinbefore described outside the entrance to an MRI room would allow an alert to be sounded before entry.

The invention claimed is:

1. A security screening apparatus for differentiating between ferromagnetic objects having different magnetisation, comprising:
    at least one magnetic sensor arranged to produce a signal indicative of an ambient magnetic field or gradient over a zone of sensitivity around the sensor;
    a signal processing circuit configured to receive as an input the signal from the magnetic sensor;
    a detection circuit configured to determine whether a signal is above a detection threshold, and, in response to a detection, emit an alert signal; and
    a detection zone defining module configured to define a detection zone within the zone of sensitivity, the detection zone including an inner bound at a predetermined distance from the magnetic sensor,
    wherein the detection zone defining module is configured such that objects with a large magnetization, such as rifles, shotguns, or shrapnel suicide vests, are detectable within the detection zone to the extent that they cause an alert signal to be emitted, whilst objects with a smaller magnetization do not cause an alert to be emitted, and
    wherein the predetermined limit is between 30 and 500 mA/m2, or more preferably between 70 and 300 mA/m2, or most preferably is substantially 100 mA/m2.

2. The security screening apparatus as claimed in claim 1, wherein the distance between the sensor and the inner bound is at least 30 cm.

3. The security screening apparatus as claimed in claim 1, wherein the detection threshold is determined by a user-operable control which is adjustable to enable objects with smaller magnetization to pass through the detection zone without causing an alert to be emitted.

4. The security screening apparatus as claimed in claim 1, wherein the detection zone also includes an outer bound, whereby objects with a large magnetisation are detectable between the inner and outer bounds to the extent that they cause an alert signal to be emitted.

5. The security screening apparatus as claimed in claim 4, wherein the distance between the inner and outer bounds is large enough to contain the whole body of a person.

6. The security screening apparatus as claimed in claim 4, wherein the distance between the inner and outer bounds is at least 60 cm.

7. The security screening apparatus as claimed in claim 1, wherein objects with a large magnetisation are defined as those with a magnetisation above a predetermined limit.

8. The security screening apparatus as claimed in claim 7, wherein the predetermined distance is determined by a function of the predetermined limit and a threshold sensitivity of the apparatus.

9. The security screening apparatus as claimed in claim 1, wherein each bound of the zone of sensitivity includes one or more physical barriers.

10. The security screening apparatus as claimed in claim 9, wherein the physical barrier allows magnetic fields to pass through relatively unimpeded.

11. The security screening apparatus as claimed in claim 1, wherein each bound of the detection zone includes one or more guidelines.

12. The security screening apparatus as claimed in claim 1, further comprising a rangefinder for detecting when a person passes outside of the detection zone, wherein the rangefinder is configured to emit a further alert signal upon a person passing outside of the detection zone.

13. The security screening apparatus as claimed in claim 1, wherein the alert signal and/or further alert signal includes a visible alert, an audible alert, or an electronic signal.

14. The security screening apparatus as claimed in claim 1, wherein the alert signal and/or further alert signal is configured to activate a remote alarm unit.

15. A method of erecting a security screening apparatus, the method comprising:
    providing a security screening apparatus for differentiating between ferromagnetic objects having different magnetisation as in claim 1,
    positioning the security screening apparatus or a detection zone defining module configured to define a detection zone within the zone of sensitivity, such that an inner bound of the detection zone is at least a predetermined distance from the at least one magnetic sensor such that objects with a large magnetization, such as rifles, shotguns or shrapnel suicide vests, are detectable within the detection zone to the extent that they cause an alert signal to be emitted, whilst objects with a smaller magnetization do not cause an alert to be emitted.

16. The method as claimed in claim 15, further comprising the step of adjusting a detection threshold determined by a user-operable control to enable objects with a smaller magnetisation to pass through the detection zone without causing an alert to be emitted.

17. The method as claimed in claim 15, further comprising the step of positioning the security screening apparatus or the detection zone defining module such that an outer bound is provided on the detection zone such that objects with a large magnetization are detectable between the inner and outer bounds to the extent that they cause an alert signal to be emitted.

18. The method as claimed in claim 15, further comprising use of an instructing device for positioning security screening apparatus or the detection zone defining module.

19. The method of claim 18, wherein the instructing device includes an instruction manual.

* * * * *